(12) United States Patent
Paavola et al.

(10) Patent No.: US 11,573,055 B2
(45) Date of Patent: Feb. 7, 2023

(54) VAPOR CHAMBER AND MEANS OF ATTACHMENT

(71) Applicant: Intel Corporation, Santa Clara, CA (US)

(72) Inventors: Juha Tapani Paavola, Hillsboro, OR (US); Mark Carbone, Cupertino, CA (US); Vivek Paranjape, Portland, OR (US); Prakash Kurma Raju, Bangalore (IN); Mikko Antero Makinen, San Jose, CA (US); Christopher M. Moore, Hillsboro, OR (US); Gustavo Fricke, San Jose, CA (US); Kathiravan D, Bangalore (IN); Ritu Bawa, Bangalore (IN); Nehakausar Shaikh Ramjan Pinjari, Bangalore (IN); Hari Shanker Thakur, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 157 days.

(21) Appl. No.: 16/728,812

(22) Filed: Dec. 27, 2019

(65) Prior Publication Data

US 2020/0132391 A1 Apr. 30, 2020

(51) Int. Cl.
 *F28D 15/04* (2006.01)
 *H01L 23/427* (2006.01)
 *H05K 7/20* (2006.01)

(52) U.S. Cl.
 CPC ............ *F28D 15/04* (2013.01); *H01L 23/427* (2013.01); *H05K 7/20336* (2013.01)

(58) Field of Classification Search
 CPC ...... F28D 15/04; F28D 15/043; F28D 15/046; F28D 2015/0216; H01L 23/427; H05K 7/20336
 (Continued)

(56) References Cited

U.S. PATENT DOCUMENTS

2006/0098411 A1* 5/2006 Lee ................. F28D 15/0233
                                                        361/704
2007/0272399 A1* 11/2007 Nitta ................. H01L 23/427
                                                        165/185

(Continued)

FOREIGN PATENT DOCUMENTS

| CN | 113056162 A | 6/2021 | |
|---|---|---|---|
| EP | 3842725 A1 | 6/2021 | |
| WO | WO-2018198375 A1 * | 11/2018 | ......... H05K 7/20336 |

OTHER PUBLICATIONS

European Extended Search Report issued in EP Application No. 20197911.9 dated Feb. 15, 2021; 7 pages.

*Primary Examiner* — Justin M Jonaitis
(74) *Attorney, Agent, or Firm* — Patent Capital Group

(57) ABSTRACT

Particular embodiments described herein provide for an electronic device that can be configured to include a vapor chamber and means of attachment for the vapor chamber. The vapor chamber can include one or more columns, where at least a portion of the columns include fiber braids and one or more wicks. At least one of the wicks can also include the fiber braids. The columns can be braised to a top plate or a bottom plate of the vapor chamber. The vapor chamber can be secured over a heat source using a vapor chamber securing means that can include spring arms. The spring arms can bend, flex, rotate, etc. to absorb some of the force when vapor chamber is secured over the heat source.

16 Claims, 11 Drawing Sheets

(58) Field of Classification Search
USPC .................................................. 165/104.26
See application file for complete search history.

(56) References Cited

U.S. PATENT DOCUMENTS

| | | |
|---|---|---|
| 2009/0025910 A1* | 1/2009 | Hoffman .............. H01L 23/427 |
| | | 165/104.26 |
| 2015/0176918 A1 | 6/2015 | Pai |
| 2016/0069616 A1* | 3/2016 | Shen .................... F28D 15/046 |
| | | 165/104.26 |
| 2017/0153066 A1* | 6/2017 | Lin ......................... F28F 1/32 |
| 2019/0219219 A1* | 7/2019 | Inagaki .............. H05K 7/20309 |
| 2019/0348345 A1 | 11/2019 | Parida et al. |
| 2020/0049421 A1* | 2/2020 | Wakaoka .................. F28F 3/02 |
| 2020/0256623 A1* | 8/2020 | Kojima .............. F28D 15/0233 |

\* cited by examiner

VAPOR CHAMBER AND MEANS OF ATTACHMENT

TECHNICAL FIELD

This disclosure relates in general to the field of computing and/or device cooling, and more particularly, to a vapor chamber and means of attachment.

BACKGROUND

Emerging trends in electronic devices are changing the expected performance and form factor of devices as devices and systems are expected to increase performance and function while having a relatively thin profile. However, the increase in performance and/or function causes an increase in the thermal challenges of the devices and systems. Insufficient cooling can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1:
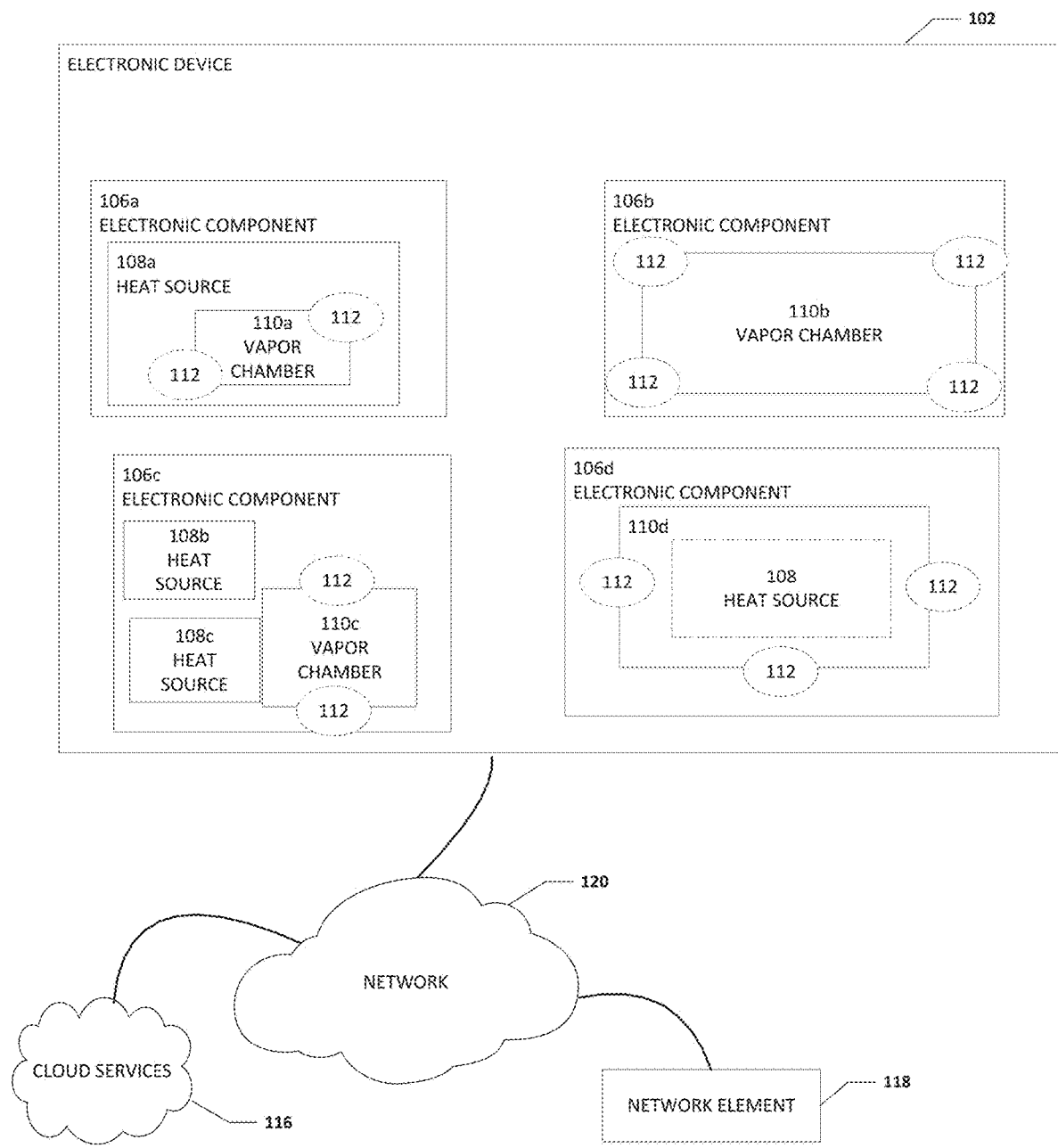
FIG. 1 is a simplified block diagram of a system to enable a vapor chamber and means of attachment, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a vapor chamber and means of attachment. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer or component disposed over or under another layer or component may be directly in contact with the other layer or component or may have one or more intervening layers or components. Moreover, one layer or component disposed between two layers or components may be directly in contact with the two layers or components or may have one or more intervening layers or components. In contrast, a first layer or first component "directly on" a second layer or second component is in direct contact with that second layer or second component. Similarly, unless explicitly stated otherwise, one feature disposed between two features may be in direct contact with the adjacent features or may have one or more intervening layers.

Implementations of the embodiments disclosed herein may be formed or carried out on a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example.

Turning to FIG. 1, FIG. 1 is a simplified block diagram of an electronic device 102 configured with a vapor chamber and means of attachment, in accordance with an embodiment of the present disclosure. In an example, electronic device 102 can include one or more electronic components 106. For example, as illustrated in FIG. 1, electronic device 102 includes electronic components 106a-106d. Electronic component 106a can include heat source 108a and vapor chamber 110a. Vapor chamber 110a can be coupled to heat source 108a using vapor chamber securing means 112. Electronic component 106b can include vapor chamber 110b. Vapor chamber 110b can be coupled to electronic component 106b using vapor chamber securing means 112. Electronic component 106c can include heat sources 108b and 108c and vapor chamber 110c. Vapor chamber 110c can be coupled to electronic component 106c using vapor chamber securing means 112. Vapor chamber 110c can be thermally coupled to heat source 108c. Heat source 108b may not be coupled to a vapor chamber. Electronic element 106d can include heat source 108d and vapor chamber 110d. Vapor chamber 110d can be over heat source 108d and coupled to electronic component 106d using vapor chamber securing means 112. Each of heat sources 108a-108d may be a heat generating device (e.g., processor, logic unit, field programmable gate array (FPGA), chip set, integrated circuit (IC), a graphics processor, graphics card, battery, memory, or some other type of heat generating device).

Each of vapor chambers 110a-110d can include one or more braided column structures and/or one or more braided wick structures. To create the vapor chamber, columns and/or wicks in the vapor chamber can be made using a braided fiber where fiber strands are braided together. In a specific example, the braided fiber is a braided copper fiber. In other example, the braided fiber is a braided titanium fiber or some other braided thermal conductivity fiber material. The fiber strands in the braided fiber help to provide a capillary path for the liquid in the vapor chamber and help to provide support for the top and bottom plates of the vapor chamber. Using braided fiber can help to reduce the vapor chamber manufacturing time by using premade columns and wicks that include fiber strands. In addition, the braided fiber helps to reduce the weight of the columns to the vapor chamber.

Each of vapor chambers 110a-110d can be coupled to an electronic component (e.g., vapor chamber 110b coupled to electronic component 106b) and/or an electronic element (e.g., vapor chamber 110a coupled to heat source 108a) using vapor chamber securing means 112. For example, as illustrated in FIG. 1, vapor chamber 110a is coupled to heat source 108a using two (2) vapor chamber securing means 112, vapor chamber 110b is coupled to electronic component 106b using four (4) vapor chamber securing means 112, vapor chamber 110c is coupled to electronic component 106c using two (2) vapor chamber securing means 112, and vapor chamber 110d is coupled to electronic component 106d using three (3) vapor chamber securing means 112.

Each of vapor chamber securing means 112 may be a helicoidal washer that can limit a maximum axial load and help to prevent overtightening. Because of the design of vapor chamber securing means 112, vapor chamber securing means 112 starts to yield when the required load is achieved as a vapor chamber is secured to an electronic component (e.g., electronic component 106b) and/or an electronic element (e.g., heat source 108a). In addition, the configuration of vapor chamber securing means 112 can allow for the accommodation of flatness variations of the electronic component and/or an electronic element. In an example, an outer edge of vapor chamber securing means 112 can be soldered to the vapor chamber in a dimple, cavity, recess, etc. that can help to reduce system thickness, or Z-stack height. The term "Z stack height," "Z height," "Z location," etc. refers to the height along the "Z" axis of an (x, y, z) coordinate axis or cartesian coordinate system.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment.

It is to be understood that other embodiments may be utilized and structural changes may be made without departing from the scope of the present disclosure. Substantial flexibility is provided in that any suitable arrangements and configuration may be provided without departing from the teachings of the present disclosure.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance and form factor of devices as devices and systems are expected to increase performance and function while having a relatively thin profile. However, the increase in performance and/or function causes an increase in the thermal challenges of the devices and systems. For example, in some devices, it can be difficult to cool a particular heat source. One way to cool a heat source is to use a vapor chamber. A vapor chamber is a planar heat pipe that typically includes a hermetically sealed hollow vessel, a working fluid, and a closed-loop capillary recirculation system. The vapor chamber works on the principle of phase change of liquid which helps in increasing the heat transfer.

The vapor chamber is typically made from a top copper plate and a bottom copper plate with an internal wick structure. As heat is applied to the vapor chamber from a heat source, water, or some other fluid inside the vapor chamber, boils and turns to a gas, which then travels to the colder region of the vapor chamber. From the colder region of the vapor chamber, the heat is dissipated where it condenses back to a liquid. The heat is dissipated through an external heat exchanger, heat pipe, or some other thermal system for dissipating heat. The evaporating and condensing of the water forms a pumping action to move the water or other fluid (and thus the heat) from the area of the heat source to other areas of the vapor chamber. There are various types of wick structure that can be used within the vapor chamber but most current vapor chambers are classified as powder or mesh. In both cases, the powder or mesh line copper plate surfaces to allow water to flow within the area of the vapor chamber. Typically, copper columns are used throughout the vapor chamber to support the plates that act as the top and bottom of the vapor chamber.

The columns are pillar like structures that are attached to a top plate and/or a bottom plate through a sintering process. This requires high sintering time and increases manufacturing time of vapor chamber because the sintering process generally takes a relatively long time and must be done slowly. In addition, the process of forged or sintered columns adds weight to the vapor chamber as the columns are typically relatively thick copper blocks.

Vapor chambers, like heat pipes, do not actually dissipate the heat to the environment but serve to move heat efficiently within a thermal system. Typical thermal conductivity of a vapor chamber ranges from 3000-10000 W/m-K. However, the cost of a vapor chamber can be relatively high due to the multiple steps involved in the manufacturing process of current vapor chambers (e.g., plate cutting per need followed by wick sintering, pillar sintering, end welds, liquid charging, and vacuum sealing, etc.).

Most current thin vapor chambers are manufactured using the two-plate approach where two copper plates 0.1-0.2 mm thick with wicks attached to the copper plates are placed on top of each other and separated by columns. These columns provide mechanical strength to the vapor chamber as well as capillary action for the liquid to return towards the heat source. The columns are made from powdered copper sintered on the thin plates and both the plates are then sprayed or filled with copper powder or mesh and sintered. This forms the capillary path for the fluid on the top and bottom plate. These columns can be made as a corrugated sheet of columns or from powdered copper sintered to one of the plates. The corrugated sheet of columns adds weight to the vapor chamber and powdered copper columns increases manufacturing time due to the long sintering operation.

The sintering process takes around twenty-four (24) hours which can be a relatively long time in a mass production manufacturing process. This also increases the cost and manufacturing time of the vapor chamber. In general, the vapor chamber cost can be split as material being about twenty-five percent (25%) of the total cost, labor being about twenty-five percent (25%) of the total cost, manufacturing being about twenty percent (20%) of the total cost, amortization and others-factors being about fifteen percent (15%) of the total cost, and yield loss being about fifteen percent (15%) of the total cost. Yield losses are due to flatness variations, leakage, cosmetics issues (e.g., dents and bends), brazing issues, etc. Yield loss can be around twenty percent (20%) of the total cost for a one (1) mm vapor chamber and about thirty percent (30%) of the total cost for a 0.6 mm vapor chamber. What is needed is a means, system, apparatus, method, etc. to help reduce the manufacturing time of the vapor chamber as well as help to reduce the weight of the vapor chamber.

In addition, while use of the vapor chamber as a passive cooling system in mobile products is rising, the vapor chamber manufacturing tolerances are quite big, and therefore there is a risk that the vapor chamber bondline will be unloaded which can cause poor thermal performance, or will be loaded uneven or too high which can cause cracks in the structure that is bonded to the vapor chamber. In some examples, a separate soldered pedestal is used to help secure the vapor chamber to a printed circuit board (PCB) and/or over the heat source. A separate soldered pedestal is not a good solution, because it can increase die area thickness and thereby the device total thickness. In addition, soldered pedestal tolerances are not tight and often are +/−0.05 mm after milling and +/−0.10 mm after soldering. The pedestal cannot be milled after soldering because it will break the weak mesh and skin bonding of the vapor chamber. Further, due to tolerance variations, all parts have to be measured manually and that can be an expensive process and cause low yields which is not good for mass production. Also, the pedestal can increase the stiffness locally, which makes the required tolerance window even tighter. In addition, separate soldered parts between the heat source and the vapor chamber can decrease thermal performance. In some examples, there may be tall components between the PCB and screw attachment. In these examples, the pedestal and the standoff support frame have to be different elements, which makes the Z-tolerance even worst and can be about +/−0.20 mm. What is needed is a means, system, apparatus, method, etc. of securing the vapor chamber to a PCB that can help to limit the maximum axial load and help prevent overtightening.

A system to enable a vapor chamber and means of attachment, as outlined in FIG. 1, can resolve these issues (and others). In an example, a vapor chamber with a braided structure can help to reduce the vapor chamber cost by reducing the manufacturing time. Fiber strands may be used to create one or more braided column structures and/or one or more braided wick structures of the vapor chamber. The one or more braided column structures and/or one or more braided wick structures can be attached to the vapor chamber top and bottom plates. The one or more braided column structures and/or one or more braided wick structures can be premade separately before the vapor chamber manufacturing process, thereby reducing manufacturing time of the vapor chamber. Also, the vapor chamber can be coupled to a PCB using a helicoidal washer that can limit the maximum axial load and help to prevent damage from overtightening. Because of the design of the washer, the washer starts to yield when the required load is achieved. In addition, the configuration of the washer can allow for the accommodation of flatness variations.

In an example, to create the vapor chamber, wick and columns in the vapor chamber can be made using copper fiber where copper fiber strands are braided together. In some examples, titanium fiber strands are braided together or some other thermally conductivity fiber material may be braided together. This braided structure can be brazed to the top plates and bottom plates of the vapor chamber. The term "brazed" includes attaching of the fiber braid strands through welding, soldering, sintering the copper fiber strand to the top plate of vapor chamber. In another example, the pillar structure can also be manufactured through a punching process, a forging process, a forming process, or a metal etching process. The fiber strands can provide a capillary path for the vapor chamber and add stiffness to the top and bottom plates and help to keep the vapor chamber from collapsing.

Using braided copper fiber can help to reduce the vapor chamber manufacturing time by using already available columns and wicks in form of a fiber braid. In addition, the braided copper fiber helps to reduce the weight of the copper columns. Also, the fiber wick structure shows better thermal performance compared to sintered and composite wick structures.

More specifically, the column structure and wick structure can be made in the form of fiber braids. For the columns, the fiber braids can be pre-made before the vapor chamber is manufactured and cut into required height as per thickness of vapor chamber. The fiber braids can then be placed in between the two plates of the vapor chamber and brazed together. The fiber braids can be made into long strands and cut into smaller elements as per need. This helps reduce the manufacturing time of the vapor chamber because during high volume manufacturing, the fiber braids can be cut to a desired height as per vapor chamber thickness. Also, the capillary performance of a fiber braid-based heat pipe can perform better than the capillary performance of a composite or sintered heat pipe In another example, an integrated column and wick structure can be made through the use of weaving copper fiber strands using the concept of knitting or through a process that is similar to what is done in cloth weaving. During the weaving process, knots can be provided at predetermined locations to act as columns. This process can integrate columns and wicks together and remove the sintering process involved in bonding copper columns to the wick. In yet another example, a perforated copper pillar can be achieved by various manufacturing techniques like chemical etching, stamping, forging, and/or punching operations in one of the plates of the vapor chamber.

The vapor chamber can be coupled to an electronic component, (e.g., electronic component 106*b*), an electronic element (e.g., heat source 108*a*), a PCB, motherboard, etc. using a vapor chamber securing means (e.g., vapor chamber securing means 112). The vapor chamber securing means can be configured to limit the maximum axial load and help to prevent overtightening. The vapor chamber securing means may be a helicoidal washer with cutouts in order to mitigate the effects of high vertical loads and high tightening torque. The cutouts can be located in a transition area between a middle portion of the vapor chamber securing means and an outside portion of the vapor chamber securing means. In a specific example, the middle portion can include a screw boss that receives a threaded attachment means and the outside portion can include a flange that is soldered to the vapor chamber. The cutout can be radial or curved. If the cutout is curved, it can help to prevent screw/thread failure in an overtightening case. For example, if the cutout is curved, when the maximum tightening moment is achieved, the screw boss starts to lift to decrease load which can help to prevent a screw/thread failure.

In a specific example for a 0.20 mm and 0.40 mm copper washer construction of the vapor chamber securing means, the nominal axial target deformation is 0.25 mm, which leads to minimum tolerance deformation of 0.05 mm and maximum deformation of 0.45 mm. The force difference between minimum and maximum is 0.5 newtons (or about 0.112 pound force) for 0.20 mm thickness and two (2) newtons (or about 0.45 pound force) for 0.40 mm thickness. Thus, the variation force range is about ten percent (10%) of the total axial screw force. A thickness of 0.30 mm gives the total package load of about eight (8) pound force (or 35.59 newtons) to about nine (9) pound force (or about 40.03 newtons) with four screws and the maximum load is about ten (10) pound force (or about 44.48 newtons). The ultimate moment for an M1.2 screw is slightly over thirty (30) newton-mm, which can be achieved relatively easily in normal cases and the configuration of the vapor chamber securing means can help keep that moment from being be achieved. Overtightening up to twenty-five (25) newton-mm will cause some permanent deformation to the vapor chamber securing means, which can decrease axial load by about thirty percent (30%).

Vapor chamber securing means is not limited to only use with a vapor chamber. Similar elastic, plastic, or some other material with the configuration as the vapor chamber securing means can be milled or stamped to a heat pipe, cold plate, some other thermal element, or other component. If vapor chamber securing means is used with a cold plate, separate leaf springs are not needed. This allows for more freedom for board design, because screw locations for the cold plate can be determined relatively freely and do not have to be at the end of the leaf spring.

In an example implementation, electronic device 102, is meant to encompass a computer, a personal digital assistant (PDA), a laptop or electronic notebook, a cellular telephone, an iPhone, a tablet, an IP phone, network elements, network appliances, servers, routers, switches, gateways, bridges, load balancers, processors, modules, or any other device, component, element, or object that includes a heat source. Electronic device 102 may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Electronic device 102 may include virtual elements.

In regards to the internal structure, electronic device 102 can include memory elements for storing information to be used in operations. Electronic device 102 may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for operations described herein. This includes the memory elements being able to store software, logic, code, or processor instructions that are executed to carry out activities or operations.

Additionally, heat source 104 may be or include one or more processors that can execute software or an algorithm. In one example, the processors can transform an element or an article (e.g., data) from one state or thing to another state or thing. In another example, activities may be implemented with fixed logic or programmable logic (e.g., software/computer instructions executed by a processor) and the heat elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Electronic device 102 may be a standalone device or in communication with cloud services 116 and/or one or more network elements 118 using network 120. Network 120 represents a series of points or nodes of interconnected communication paths for receiving and transmitting packets of information. Network 120 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 120, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

Figure 2A:
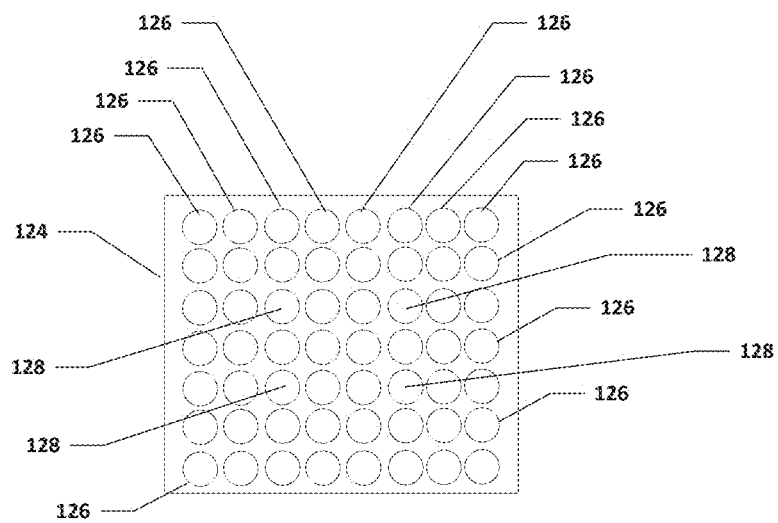
FIG. 2A is a simplified block diagram of a partial view of a system to enable a vapor chamber, in accordance with an embodiment of the present disclosure.

Turning to FIG. 2A, FIG. 2A is a simplified block diagram of a portion of vapor chamber 110e. Vapor chamber 110e can include a bottom plate 124 and one or more columns 126. Columns 126 are pillar or column like structures that help to provide mechanical strength to vapor chamber 110e as well as provide capillary action for the liquid inside vapor chamber 110e. Columns 126 can be made of braided copper, braided titanium or some other braided material that can help to provide mechanical strength to vapor chamber 110e as well as capillary action for the liquid inside vapor chamber 110e. In an example, a plurality of columns 126 can be arranged in a grid like pattern, for example as illustrated in FIG. 2A. In some examples, one or more support columns 128 can be added to provide additional support. Support columns 128 may be non-braided fiber columns that provide additional support for vapor chamber 110e. In other examples, the plurality of columns 126 and optionally one or more support columns 128 can be arranged according to design constraints and/or other factors.

Figure 2B:
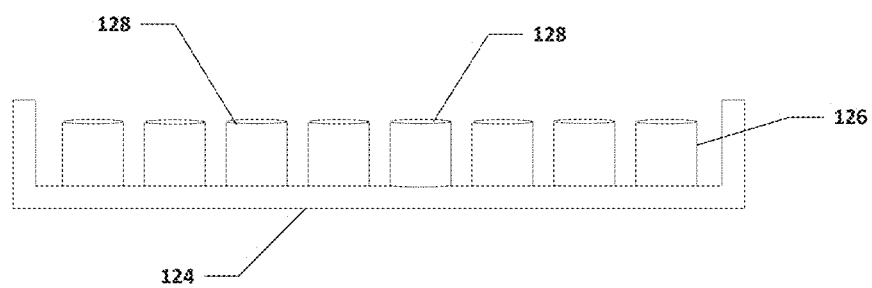
FIG. 2B is a simplified block diagram of a partial view of a system to enable a vapor chamber, in accordance with an embodiment of the present disclosure.

Turning to FIG. 2B, FIG. 2B is a simplified block diagram cut away side view of a portion of vapor chamber 110e. Vapor chamber 110e can include a bottom plate 124 and one or more columns 126. In some examples, one or more support columns 128 can be added to provide additional support to vapor chamber 110e.

Figure 2C:
FIG. 2C is a simplified block diagram of a partial view of a system to enable a vapor chamber, in accordance with an embodiment of the present disclosure.

Turning to FIG. 2C, FIG. 2C is a simplified block diagram of a portion of vapor chamber 110e. Vapor chamber 110e can include a top plate 130. In some examples, instead of bottom plate 124 including one or more columns 126, as illustrated in FIGS. 2A and 2B, one or more columns 126 may be on top plate 130. In addition, top plate 130 can include one or more support columns 128 to provide additional support to vapor chamber 110e.

Figure 2D:
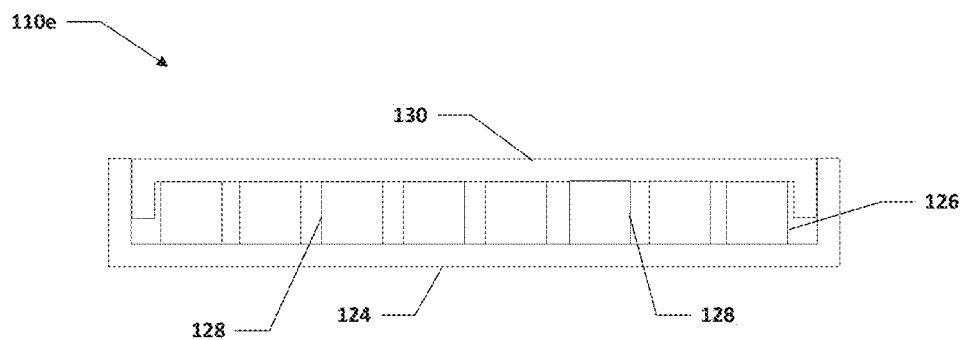
FIG. 2D is a simplified block diagram of a partial view of a system to enable a vapor chamber, in accordance with an embodiment of the present disclosure.

Turning to FIG. 2D, FIG. 2D is a simplified block diagram of vapor chamber 110e. Vapor chamber 110e can include bottom plate 124, one or more columns 126, and top plate 130. Vapor chamber 110e can be created by securing bottom plate 124 to top plate 130. In an example, bottom plate 124 is secured to top plate 130 using a brazing process, soldering process, sintering process, or by direct punching, forming, or forging methods. In some examples, one or more support columns 128 can be added to provide additional support to vapor chamber 110e.

Figure 3A:
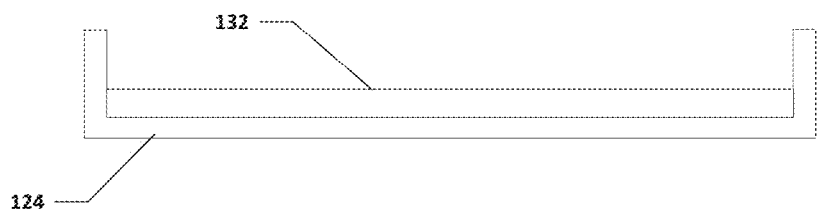
FIG. 3A is a simplified block diagram of a partial view of a system to enable a vapor chamber, in accordance with an embodiment of the present disclosure.

Turning to FIG. 3A, FIG. 3A is a simplified block diagram of a portion of vapor chamber 110f. Vapor chamber 110f can include bottom plate 124 and wick 132. Wick 132 can be made using copper fiber where copper fiber strands are braided together, titanium fiber where titanium fibers are braided together, or some other some other conductivity fiber strands that are braided together. In other examples, wick 132 may be made of a mesh structure.

Figure 3B:
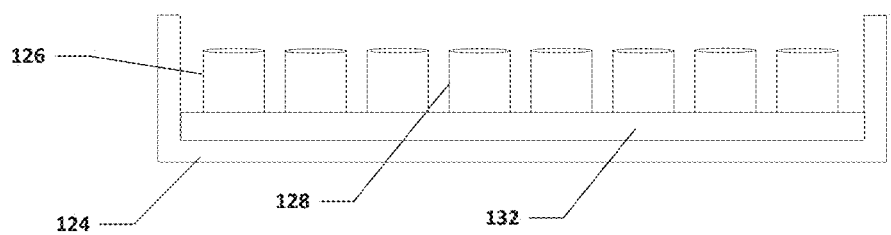
FIG. 3B is a simplified block diagram of a partial view of a system to enable a vapor chamber, in accordance with an embodiment of the present disclosure.

Turning to FIG. 3B, FIG. 3B is a simplified block diagram of a portion of vapor chamber 110f. As illustrated in FIG. 3B, a plurality of columns 126 can be secured to wick 132. In an example, the plurality of columns 126 are secured to wick 132 by attaching the fiber braid strands through welding, soldering, sintering the copper fiber strand to the top plate of vapor chamber, etc. In some examples, wick 132 is configured as a fine mesh structure and the mesh can also be a knotted structure where the knots can act as pillars. In some examples, one or more support columns 128 can be added to provide additional support.

Figure 3C:
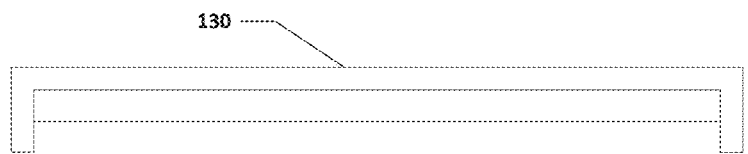
FIG. 3C is a simplified block diagram of a partial view of a system to enable a vapor chamber, in accordance with an embodiment of the present disclosure.

Turning to FIG. 3C, FIG. 3C is a simplified block diagram of a portion of vapor chamber 110f. Vapor chamber 110f can include a top plate 130 and wick 132. In some examples, instead of bottom plate 124 including one or more columns 126, as illustrated in FIG. 3B, one or more columns 126 may be on top plate 130. In addition, top plate 130 can include one or more support columns 128 to provide additional support to vapor chamber 110l.

Figure 3D:
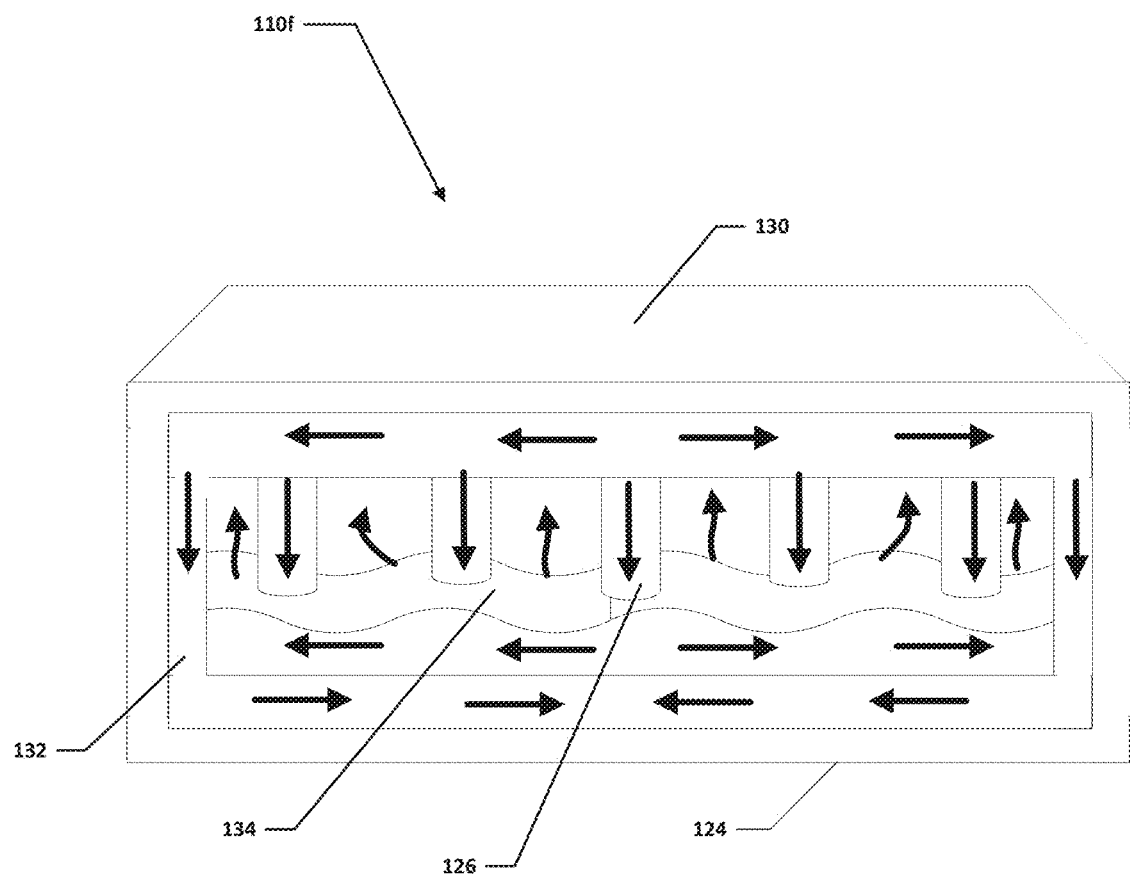
FIG. 3D is a simplified block diagram of a partial view of a vapor chamber, in accordance with an embodiment of the present disclosure.

Turning to FIG. 3D, FIG. 3D is a simplified block diagram of vapor chamber 110l. Vapor chamber 110l can include a bottom plate 124, one or more columns 126, top plate 130, wick 132, and fluid 134. Fluid 134 can be water. Vapor chamber 110l can be created by securing bottom plate 124 to top plate 130. Columns 126 can help to provide mechanical strength to vapor chamber 110f as well as capillary action for the liquid inside vapor chamber 110f. In some examples, one or more support columns 128 can be added to provide additional support to vapor chamber 110f.

In an example, at a hot interface of vapor chamber 110f (e.g., the area where the outer wall of bottom plate 124 is proximate to a heat source) fluid 134 turns into a vapor by absorbing heat from bottom plate 124. The vapor then travels through vapor chamber 110f to a cooler interface (e.g., top plate 130), condenses back into fluid 134, and releases heat to the cooler interface. Fluid 134 then returns to the hot interface through capillary action, centrifugal force, gravity, etc. and the cycle repeats.

Figure 4:
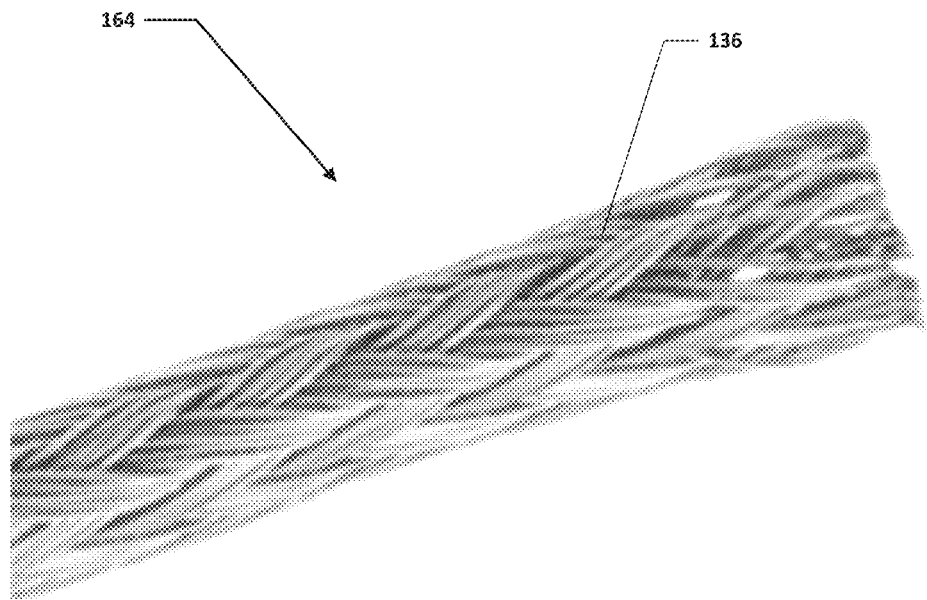
FIG. 4 is a simplified diagram of a partial perspective view of a system to enable a vapor chamber, in accordance with an embodiment of the present disclosure.

Turning to FIG. 4, FIG. 4 is a simplified block diagram of a portion of a fiber braid 164. Fiber braid 164 can include fiber strands 136. Fiber strands 136 may be braided copper fiber, braided titanium fiber, or some other braided thermal conductivity fiber material. In an example, fiber strands 136 are braded or woven together to create fiber braid 164. Fiber braid 164 can be brazed to the bottom and/or the top of the vapor chamber, as illustrated in FIGS. 2D and 3D, to create one or more columns 126 and/or one or more wicks 132. Fiber strands 136 in fiber braid 164 help to provide a capillary path for the fluid in vapor chamber and add support to the top plate and the bottom plate of the vapor chamber.

Fiber braid 164 can help to reduce the weight of column 126 and/or wick 132. Also, using fiber strands 136 to create a fiber wick structure for column 126 and/or wick 132 allows for a better thermal performance compared to sintered and composite wick structures. In addition, using fiber braid 164 can help to reduce the vapor chamber manufacturing time by using already available wick and columns in form of fiber braid 164. For example, fiber braid 164 can be made before the manufacturing of the vapor chamber and then cut to the required height per the thickness of a vapor chamber.

Figure 5:
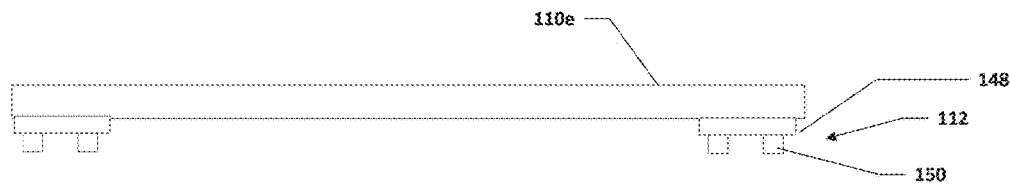
FIG. 5 is a simplified block diagram view of a system to enable a vapor chamber and means of attachment, in accordance with an embodiment of the present disclosure.

Turning to FIG. 5, FIG. 5 is a simplified block diagram of a vapor chamber 110e. In an example, one or more vapor chamber securing means 112 can be secured to vapor chamber 110e. Vapor chamber securing means 112 can include a flange 148 and one or more spring arms 150. Flange 148 can be soldered to vapor chamber 110e.

Figure 6A:
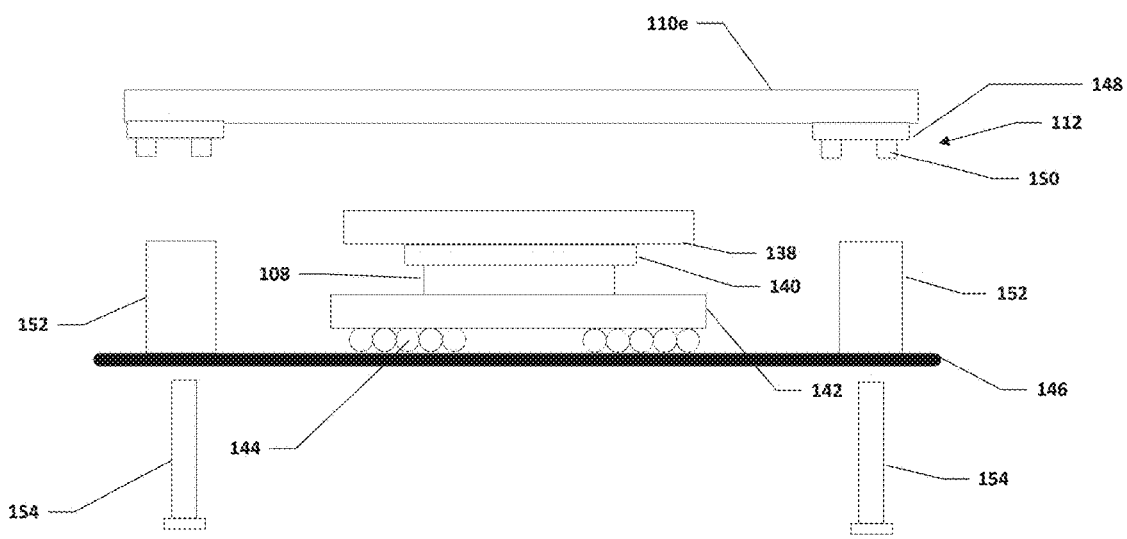
FIG. 6A is a simplified block diagram of a partial view of a system to enable a vapor chamber and means of attachment, in accordance with an embodiment of the present disclosure.

Turning to FIG. 6A, FIG. 6A is a simplified block diagram of vapor chamber 110e over a heat source 108. As illustrate in FIG. 6A, one or more vapor chamber securing means 112 can be secured to vapor chamber 110e. Vapor chamber securing means 112 can include flange 148 and one or more spring arms 150.

Heat source 108 can be on a substrate 142 and substrate 142 can be secured to a PCB 146 using a solder ball grid array 144. A thermal interface material (TIM) 140 can be over heat source 108. If there will be a gap between vapor chamber 110e and TIM 140 when vapor chamber 110e is secured to PCB 146, a pedestal 138 can be configured to close the gap. Pedestal 138 may also be used to add stiffness to vapor chamber 110e and to help provide a uniform pressure on heat source 108 from vapor chamber 110e. A riser 152 can extend from PCB 146 to help coupled vapor chamber 110e over heat source 108. Riser 152 can account for the height of solder ball grid array 144, substrate 142, heat source 108, TIM 140, and pedestal 138, if pedestal 138 is present. An attachment means 154 can be used to couple with vapor chamber securing means 112 to help secure vapor chamber 110e over heat source 108.

Figure 6B:
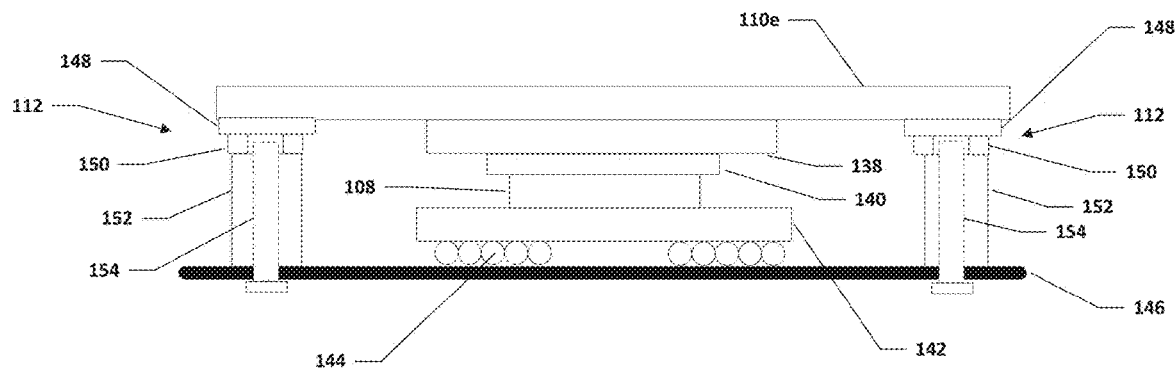
FIG. 6B is a simplified block diagram of a partial view of a system to enable a vapor chamber and means of attachment, in accordance with an embodiment of the present disclosure.

Turning to FIG. 6B, FIG. 6B is a simplified block diagram of a portion of an electronic device that includes vapor chamber 110e over heat source 108. As illustrate in FIG. 6B, vapor chamber 110e can be secured over heat source 108 using vapor chamber securing means 112. Vapor chamber securing means 112 can include flange 148 and one or more spring arms 150. Flange 148 can be coupled to vapor chamber 110e.

TIM 140 can be between heat source 108 and vapor chamber 110e. If there is a gap between vapor chamber 110e and TIM 140, pedestal 138 can be configured to close the gap. Heat source 108 can be on a substrate 142 and substrate 142 can be secured to PCB 146 using solder ball grid array 144. Vapor chamber securing means 112 can be coupled to vapor chamber 110e and attachment means 154 can extend through PCB 146 and coupled with vapor chamber securing means 112 to help secure vapor chamber 110e over heat source 108. Riser 152 can extend from PCB 146 to vapor chamber securing means 112 (more specifically, to spring arms 150 of vapor chamber securing means 112) and surround attachment means 154. Riser 152 can account for the height of solder ball grid array 144, substrate 142, heat source 108, TIM 140, and pedestal 138, if pedestal 138 is present.

Figure 7A:
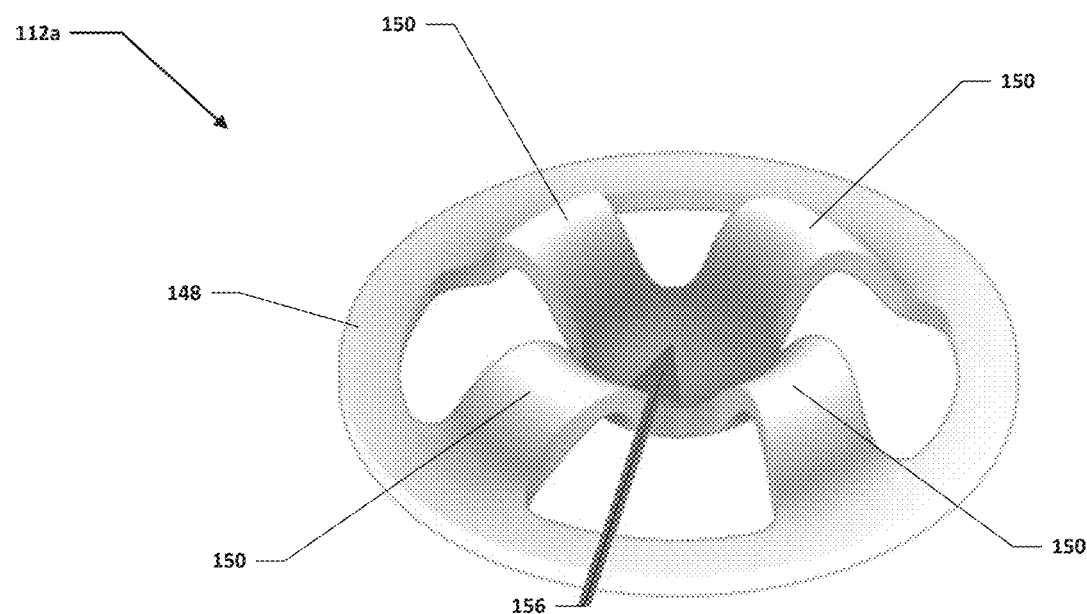
FIG. 7A is a simplified diagram of a partial view of a system to enable a vapor chamber and means of attachment, in accordance with an embodiment of the present disclosure.
Figure 7B:
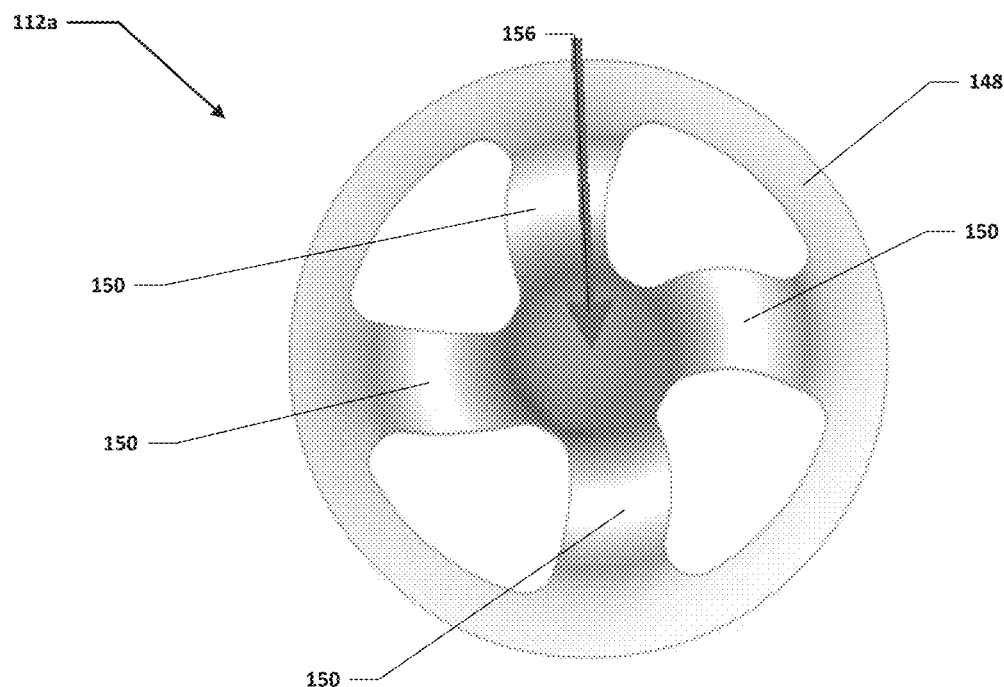
FIG. 7B is a simplified diagram of a partial view of a system to enable a vapor chamber and means of attachment, in accordance with an embodiment of the present disclosure.

Turning to FIGS. 7A and 7B, FIGS. 7A and 7B are a simplified diagram of vapor chamber securing means 112a. Vapor chamber securing means 112a can include flange 148 and plurality of spring arms 150. For example, as illustrated in FIGS. 7A and 7B, vapor chamber securing means 112a includes four (4) spring arms 150. Spring arms 150 can extend from flange 148 to a middle portion 156 of vapor chamber securing means 112a. Middle portion 156 can include an attachment mechanism that allows attachment means 154 to couple with vapor chamber securing means 112a. For example, if attachment means 154 is a screw or threaded fastener, then middle portion 156 can include threads that allow attachment means 154 to be screwed or threaded into middle portion 156 and couple with vapor chamber securing means 112a.

Figure 8A:
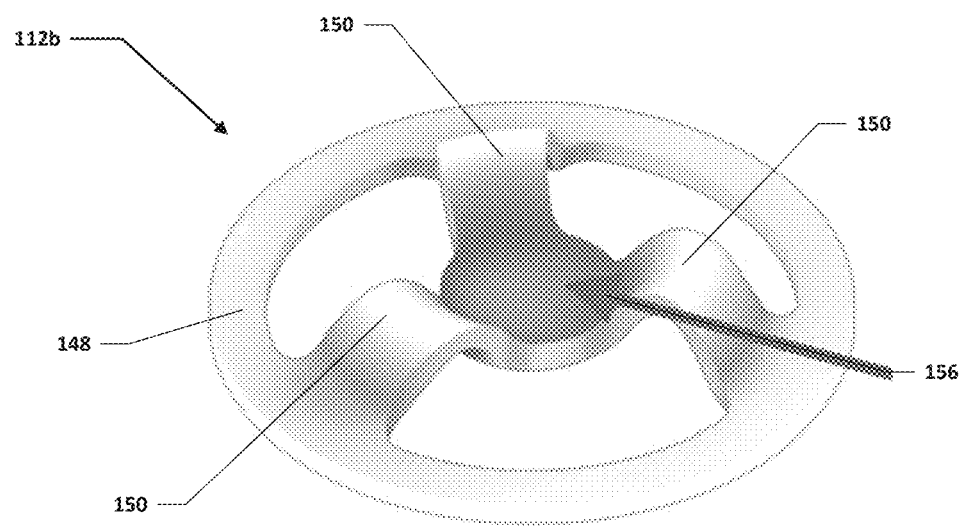
FIG. 8A is a simplified diagram of a partial view of a system to enable a vapor chamber and means of attachment, in accordance with an embodiment of the present disclosure.
Figure 8B:
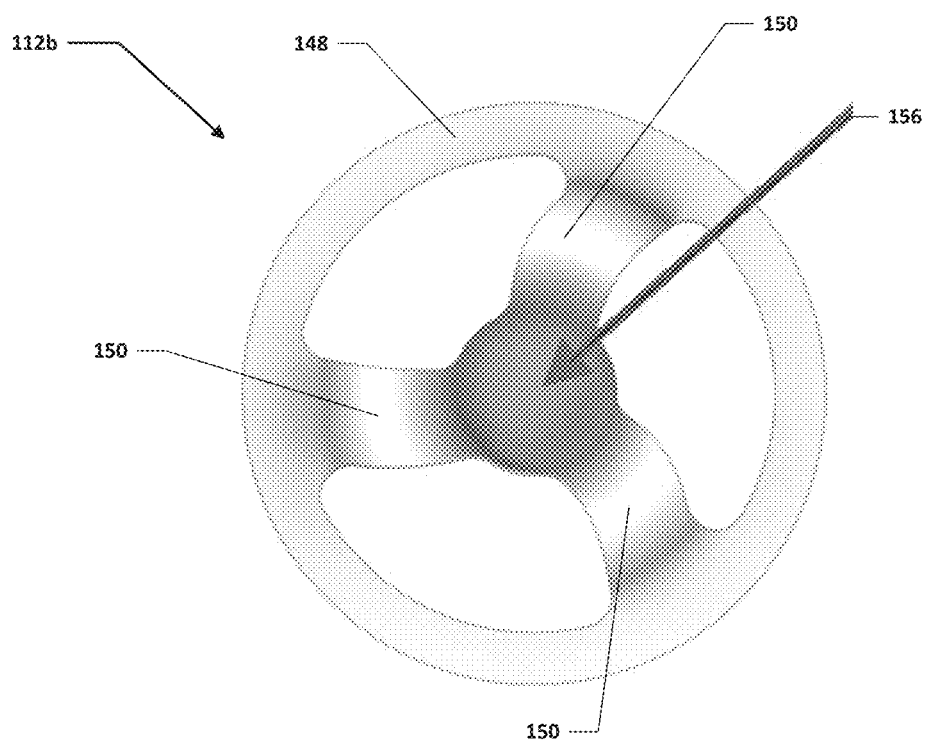
FIG. 8B is a simplified diagram of a partial view of a system to enable a vapor chamber and means of attachment, in accordance with an embodiment of the present disclosure.

Turning to FIGS. 8A and 8B, FIGS. 8A and 8B are a simplified diagram of vapor chamber securing means 112b. Vapor chamber securing means 112b can include flange 148 and plurality of spring arms 150. For example, as illustrated in FIGS. 8A and 8B, vapor chamber securing means 112b includes three (3) spring arms 150. Spring arms 150 can extend from flange 148 to middle portion 156 of vapor chamber securing means 112b. Middle portion 156 can include an attachment mechanism that allows attachment means 154 to couple with vapor chamber securing means 112b. For example, if attachment means 154 is a screw or threaded fastener, then middle portion 156 can include threads that allow attachment means 154 to be screwed or threaded into middle portion 156 and couple with vapor chamber securing means 112b.

Figure 9:
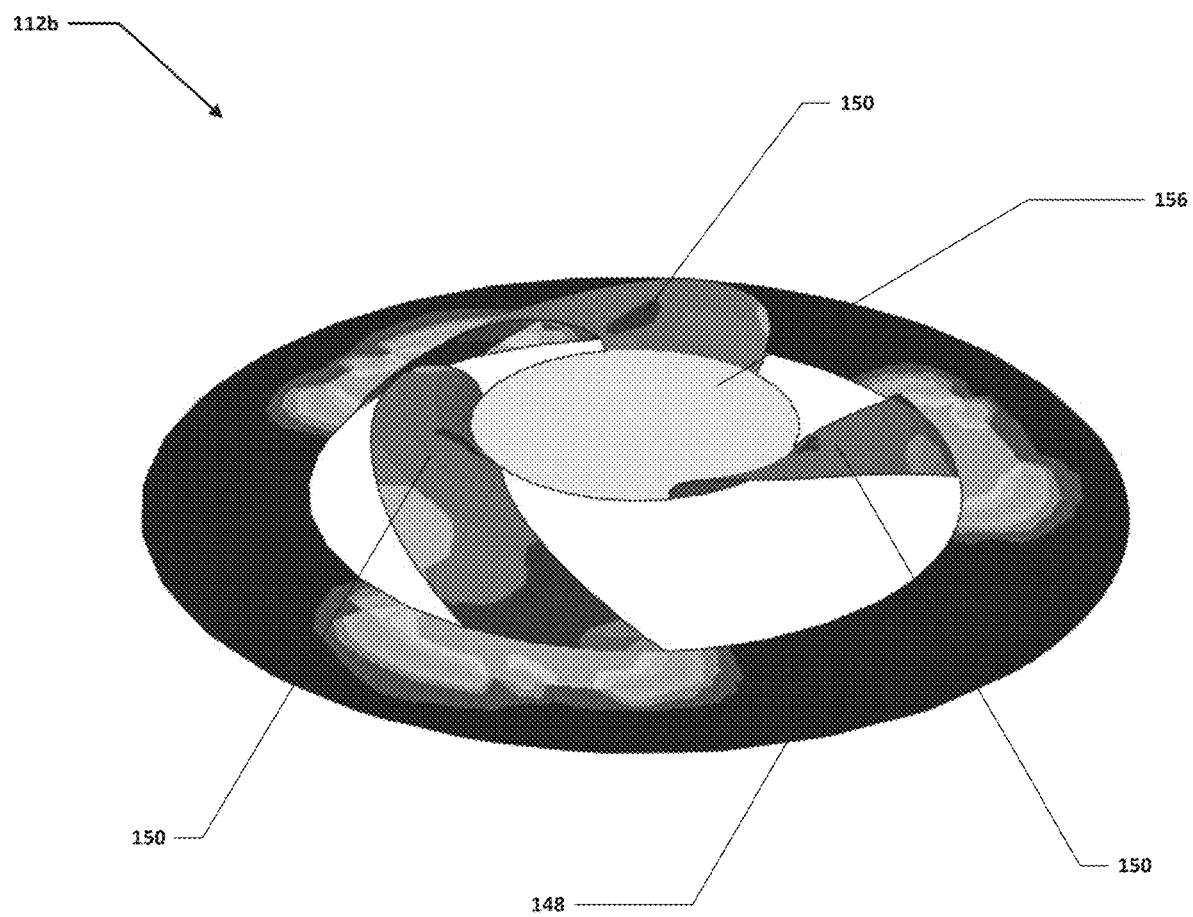
FIG. 9 is a simplified block diagram of a partial view of a system to enable a vapor chamber and means of attachment, in accordance with an embodiment of the present disclosure.

Turning to FIG. 9, FIG. 9 is a simplified diagram of an example stress field for vapor chamber securing means 112b. When attachment means 154 is coupled with vapor chamber securing means 112b, forces extend from attachment means 154 to middle portion 156 and spring arms 150. Spring arms 150 are configured to bend, flex, rotate, etc. to absorb some of the force and help prevent the force from reaching flange 148 and the vapor chamber that includes vapor chamber securing means 112b.

Figure 10A:
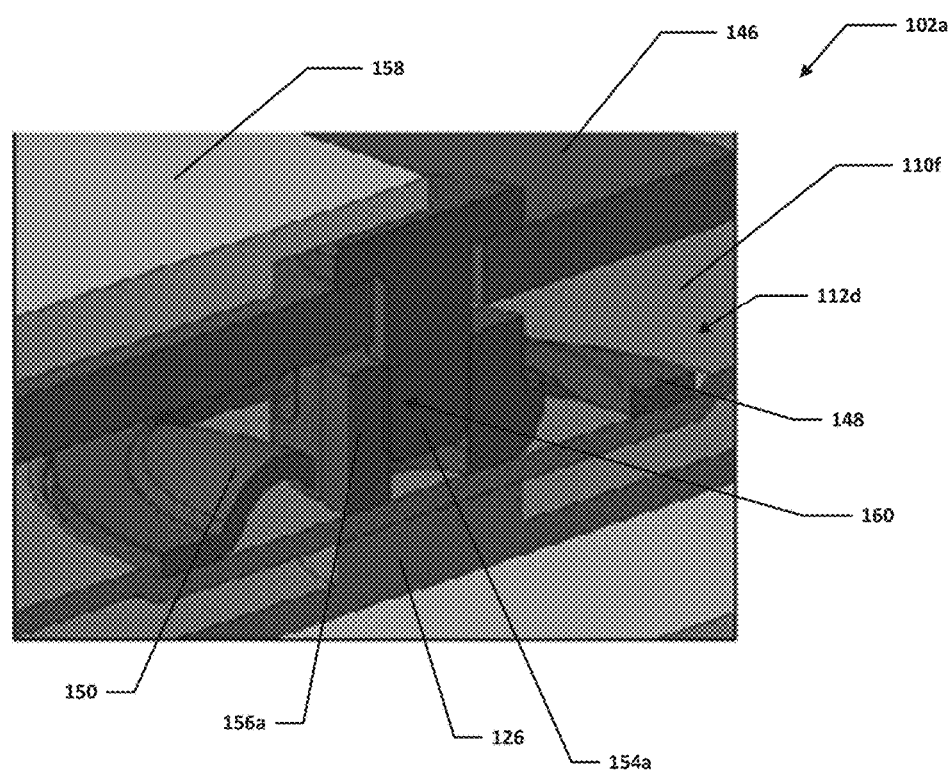
FIG. 10A is a simplified block diagram of a partial view of a system to enable a vapor chamber and means of attachment, in accordance with an embodiment of the present disclosure.
Figure 10B:
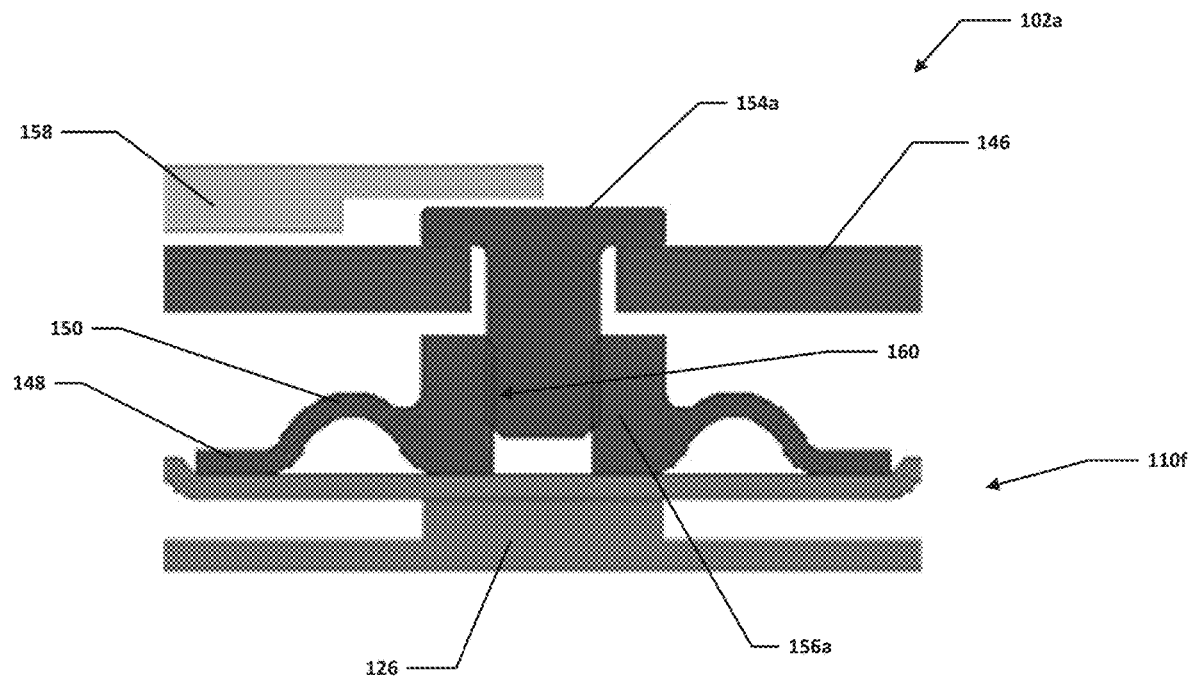
FIG. 10B is a simplified block diagram of a partial view of a system to enable a vapor chamber and means of attachment, in accordance with an embodiment of the present disclosure.

Turning to FIGS. 10A and 10B, FIGS. 10A and 10B are a simplified block diagram illustrating a portion of electronic device 102a. Electronic device 102a can include a chassis 158, PCB 146, and vapor chamber 110f. Vapor chamber securing means 112d can coupled with attachment means 154a and help to secure vapor chamber 110f to PCB 146. In an example, attachment means 154a is a threaded screw, bolt, or some other threaded attachment means. As illustrated in FIGS. 10A and 10B, vapor chamber securing means 112d can include flange 148, spring arms 150, and middle portion 156a. Middle portion 156a can include threads 160 that allow attachment means 154a to be screwed or threaded into middle portion 156a of vapor chamber securing means 112d.

Figure 11A:
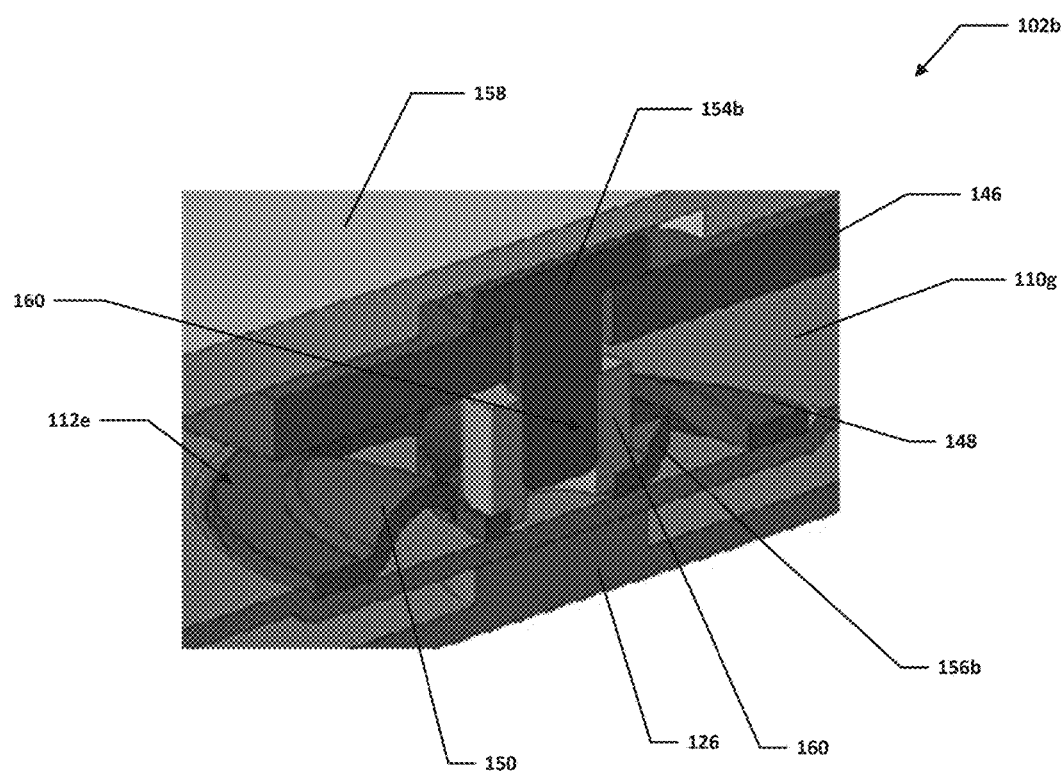
FIG. 11A is a simplified block diagram of a partial view of a system to enable a vapor chamber and means of attachment, in accordance with an embodiment of the present disclosure.
Figure 11B:
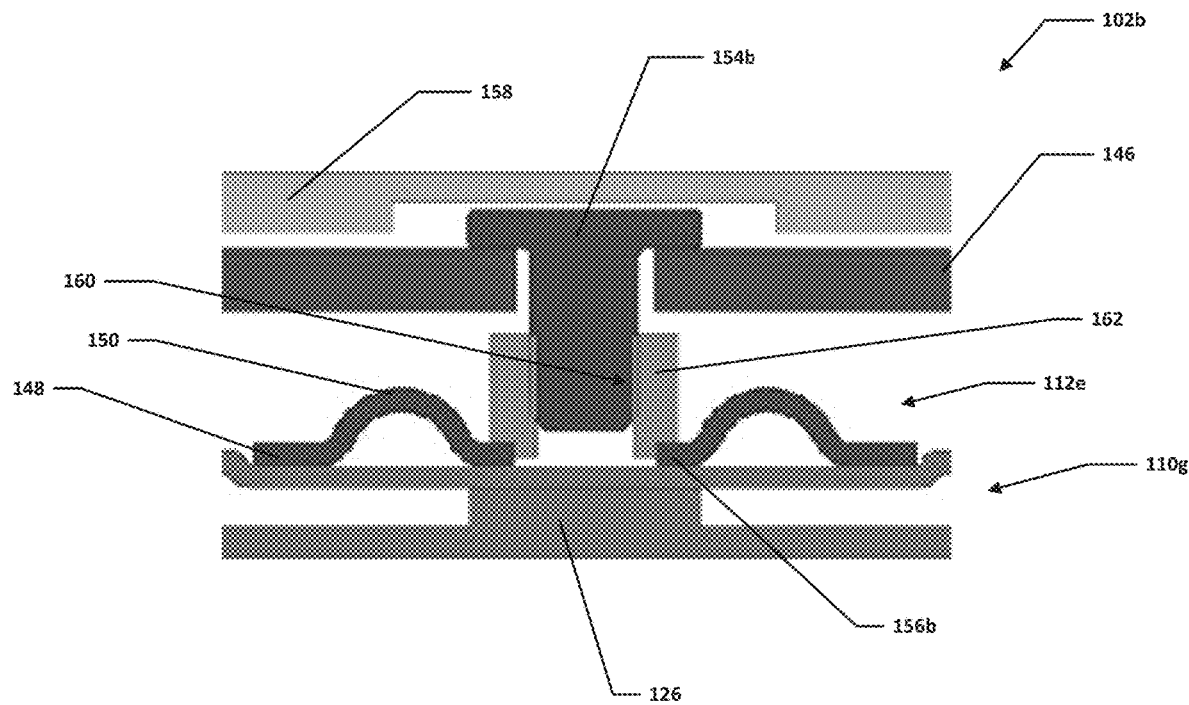
FIG. 11B is a simplified block diagram of a partial view of a system to enable a vapor chamber and means of attachment, in accordance with an embodiment of the present disclosure.

Turning to FIGS. 11A and 11B, FIGS. 11A and 11B are a simplified block diagram illustrating a portion of electronic device 102b. Electronic device 102b can include a chassis 158, PCB 146, and vapor chamber 110g. As illustrated in FIGS. 11A and 11B, vapor chamber securing means 112e can include flange 148, spring arms 150, and middle portion 156. Middle portion 156 can include a screw insert 162. In an example, screw insert 162 can be soldered or otherwise secured to middle portion 156.

Vapor chamber securing means 112e can coupled with attachment means 154b and help to secure vapor chamber 110g to PCB 146. In an example, attachment means 154b is a threaded screw, bolt, or some other threaded attachment means. Screw insert 162 can include threads 160 that allow attachment means 154b to be screwed or threaded into screw insert 162 of vapor chamber securing means 112e and help to secure vapor chamber 110g to PCB 146.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although vapor chambers 110 and vapor chamber securing means 112 have been illustrated with reference to particular elements and operations, these elements and operations may be replaced by any suitable architecture, protocols, and/or processes that achieve the intended functionality of vapor chambers 110 and vapor chamber securing means 112.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES AND EXAMPLES

In Example A1, a vapor chamber can include one or more columns, where at least a portion of the one or more columns include fiber braids and one or more wicks.

In Example A2, the subject matter of Example A1 can optionally include where at least one of the one or more wicks of the vapor chamber include the fiber braids.

In Example A3, the subject matter of any one of Examples A1-A2 can optionally include where the fiber braids are made of copper fiber or titanium fiber.

In Example A4, the subject matter of any one of Examples A1-A3 can optionally include where the one or more columns of the vapor chamber are brazed to a bottom plate of the vapor chamber.

In Example A5, the subject matter of any one of Examples A1-A4 can optionally include where the one or more columns of the vapor chamber are brazed to a top plate of the vapor chamber.

In Example A6, the subject matter of any one of Examples A1-A5 can optionally include where a portion of the one or more columns of the vapor chamber are support columns and the support columns do not include the fiber braids.

Example AA1 is a device including one or more heat sources and a vapor chamber over the one or more heat sources, where the vapor chamber includes fiber braids.

In Example AA2, the subject matter of Example AA1 can optionally include where one or more columns of the vapor chamber include the fiber braids.

In Example AA3, the subject matter of any one of the Examples AA1-AA2 can optionally include where one or more wicks of the vapor chamber include the fiber braids.

In Example AA4, the subject matter of any one of the Examples AA1-AA3 can optionally include where the fiber braids are made of copper fiber or titanium fiber.

In Example AA5, the subject matter of any one of the Examples AA1-AA4 can optionally include where one or more columns of the vapor chamber include the fiber braids and the columns are brazed to a bottom plate of the vapor chamber.

In Example AA6, the subject matter of any one of the Examples AA1-AA5 can optionally include where one or more columns of the vapor chamber include the fiber braids and the columns are brazed to a top plate of the vapor chamber.

In Example AA7, the subject matter of any one of the Examples AA1-AA6 can optionally include where one or more columns of the vapor chamber and one or more wicks of the vapor chamber include the fiber braids.

In Example AA8, the subject matter of any one of the Examples AA1-AA7 can optionally include where one or more columns of the vapor chamber are support columns and the support columns do not include the fiber braids.

Example M1 is a method including creating one or more columns for the vapor chamber from a fiber braid by cutting the fiber braid and brazing the created one or more columns to a top plate or a bottom plate to create at least a portion of the columns for the vapor chamber.

In Example M2, the subject matter of Example M1 can optionally include creating one or more wicks for the vapor chamber from the fiber braid.

In Example M3, the subject matter of any one of the Examples M1-M2 can optionally include where the fiber braid was created before creating the vapor chamber.

In Example M4, the subject matter of any one of the Examples M1-M3 can optionally include where the fiber braid is made of copper fiber or titanium fiber.

In Example M5, the subject matter of any one of the Examples M1-M4 can optionally include creating one or more support columns for the vapor chamber, where the support columns do not include the fiber braid and securing the one or more support columns to the top plate or the bottom plate.

In Example M6, the subject matter of any one of the Examples M1-M5 can optionally include where securing the top plate to the bottom plate to create the vapor chamber.

Example AAA1 is an apparatus including means for creating one or more columns for the vapor chamber from a fiber braid and means for brazing the created one or more columns to a top plate or a bottom plate to create at least a portion of the columns for the vapor chamber.

In Example AAA2, the subject matter of Example AAA1 can optionally include means for creating one or more wicks for the vapor chamber from the fiber braid.

In Example AAA3, the subject matter of any one of Examples AAA1-AAA2 can optionally include where the fiber braid was created before creating the vapor chamber.

In Example AAA4, the subject matter of any one of Examples AAA1-AAA3 can optionally include where the fiber braid is made of copper fiber or titanium fiber.

In Example AAA5, the subject matter of any one of Examples AAA1-AAA4 can optionally include means for creating one or more support columns for the vapor chamber, where the support columns do not include the fiber braid and means for securing the one or more support columns to the top plate or the bottom plate.

In Example AAA6, the subject matter of any one of Examples AAA1-AAA5 can optionally include means for securing the top plate to the bottom plate to create the vapor chamber.

What is claimed is:

1. A vapor chamber comprising:
    a top plate;
    a bottom plate; and
    a knitted wick and column structure composed of woven braided fiber strands, wherein the knitted wick and column structure includes one or more columns and each of the one or more columns are a woven knotted structure integrated into the woven braided fiber strands and the one or more columns provide support for the top plate and/or the bottom plate of the vapor chamber.

2. The vapor chamber of claim 1, wherein the woven braided fiber strands are made of copper fiber or titanium fiber.

3. The vapor chamber of claim 1, wherein the one or more columns of the vapor chamber are brazed to a bottom plate of the vapor chamber.

4. The vapor chamber of claim 1, wherein the one or more columns of the vapor chamber are brazed to a top plate of the vapor chamber.

5. The vapor chamber of claim 1, further comprising:
    one or more secondary support columns that do not include the woven braided fiber strands.

6. The vapor chamber of claim 1, wherein all of the columns of the vapor chamber include the woven braided fiber strands.

7. The vapor chamber of claim 1, wherein the knitted wick and column structure is made of copper fiber or titanium fiber.

8. The vapor chamber of claim 1, wherein the one or more columns of the vapor chamber are brazed to a bottom plate of the vapor chamber.

9. The vapor chamber of claim 1, wherein the one or more columns of the vapor chamber are brazed to a top plate of the vapor chamber.

10. A method for creating a vapor chamber, the method comprising:
    weaving braided fiber strands to create:
        a wick structures; and
        one or more columns, wherein each of the one or more columns are a woven knotted structure integrated into the wick structure, wherein the created wick structure and the created one or more columns form an integrated woven column and wick structure for the vapor chamber; and
    brazing the created wick structure and one or more columns to a top plate or a bottom plate.

11. The method of claim 10, wherein the braided fiber strands were created before creating the vapor chamber.

12. The method of claim 10, wherein the braided fiber strands are made of copper fiber or titanium fiber.

13. The method of claim 10, further comprising:
    creating one or more support columns for the vapor chamber, wherein the support columns do not include the braided fiber strands; and
    securing the one or more support columns to the top plate or the bottom plate.

14. The method of claim 10, further comprising:
    securing the top plate to the bottom plate to create the vapor chamber.

15. The method of claim 10, wherein all of the columns of the vapor chamber include the woven braided fiber strands.

16. A vapor chamber comprising:

a knitted wick and column structure that includes:

one or more columns, wherein each of the one or more columns are a woven knotted structure integrated into the knitted wick and column structure and the one or more columns provide support for a top plate and/or a bottom plate of the vapor chamber, wherein the one or more columns include fiber braids that provide a capillary action; and one or more wicks, wherein the one or more wicks include the fiber braids.

* * * * *